(12) United States Patent
He

(10) Patent No.: US 12,114,483 B2
(45) Date of Patent: Oct. 8, 2024

(54) METHODS FOR MANUFACTURING SEMICONDUCTOR DEVICES, AND SEMICONDUCTOR DEVICES

(71) Applicant: CHANGXIN MEMORY TECHNOLOGIES, INC., Hefei (CN)

(72) Inventor: Dandan He, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 401 days.

(21) Appl. No.: 17/605,011

(22) PCT Filed: Jul. 28, 2021

(86) PCT No.: PCT/CN2021/109068
§ 371 (c)(1),
(2) Date: Oct. 20, 2021

(87) PCT Pub. No.: WO2022/217782
PCT Pub. Date: Oct. 20, 2022

(65) Prior Publication Data
US 2023/0180463 A1 Jun. 8, 2023

(30) Foreign Application Priority Data
Apr. 15, 2021 (CN) .......................... 202110406661.4

(51) Int. Cl.
*H10B 12/00* (2023.01)

(52) U.S. Cl.
CPC .......... *H10B 12/482* (2023.02); *H10B 12/02* (2023.02)

(58) Field of Classification Search
CPC ......... H01L 21/76834; H01L 21/76832; H01L 23/53295; H01L 21/28518; H01L 29/45;
(Continued)

(56) References Cited

U.S. PATENT DOCUMENTS 6,150,208 A * 11/2000 Deboer ................. H01L 28/40
257/311
6,403,473 B1 6/2002 Schmidbauer et al.
(Continued)

FOREIGN PATENT DOCUMENTS

CN 104103577 A 10/2014
CN 104103578 A 10/2014
(Continued)

OTHER PUBLICATIONS

International Search Report cited in PCT/CN2021/109068, mailed Dec. 22, 2021, 10 pages.

*Primary Examiner* — Jarrett J Stark
(74) *Attorney, Agent, or Firm* — Syncoda LLC; Feng Ma

(57) ABSTRACT

The present application provides a method for manufacturing a semiconductor device, and a semiconductor device. The method includes: providing a substrate; forming a first conductive material layer on the substrate; performing plasma treatment on the first conductive material layer to form a first conductive layer; successively forming a second conductive layer, a first block layer, a third conductive layer and a fourth conductive layer on the first conductive layer; forming a dielectric layer on the fourth conductive layer, and forming an ohmic contact layer at a junction of the first conductive layer and the second conductive layer; forming an initial bit line structure; performing $NH_3/N_2$ plasma treatment on the initial bit line structure to form a second block layer on a sidewall of the first conductive layer and a third block layer on a sidewall of the ohmic contact layer.

15 Claims, 4 Drawing Sheets

(58) Field of Classification Search
CPC . H01L 29/4011; H10B 12/482; H10B 12/485; H10B 12/34; H10B 12/02
See application file for complete search history.

(56) References Cited

U.S. PATENT DOCUMENTS

| | | | |
|---|---|---|---|
| 7,118,955 | B2 | 10/2006 | Amon et al. |
| 9,159,609 | B2 | 10/2015 | Lee et al. |
| 9,165,859 | B2 | 10/2015 | Lim et al. |
| 2011/0207289 | A1* | 8/2011 | Jeong .................... H10B 63/00 438/433 |
| 2011/0241102 | A1* | 10/2011 | Cho ........................ H01L 29/78 257/329 |
| 2012/0193696 | A1* | 8/2012 | Fukushima ....... H01L 21/76897 257/306 |
| 2014/0061745 | A1* | 3/2014 | Myung ................ H10B 12/482 257/532 |
| 2015/0014759 | A1 | 1/2015 | Lee et al. |
| 2016/0126246 | A1* | 5/2016 | Lee ......................... H01L 29/45 257/296 |
| 2022/0052056 | A1* | 2/2022 | Lu ........................ H10B 12/485 |
| 2023/0217641 | A1* | 7/2023 | Chang .................... H10B 12/00 257/296 |
| 2023/0262959 | A1* | 8/2023 | Park ....................... H10B 53/30 257/296 |
| 2023/0290639 | A1* | 9/2023 | Schloss ............. C23C 16/45565 |
| 2024/0008248 | A1* | 1/2024 | Liu ...................... H10B 12/315 |
| 2024/0008263 | A1* | 1/2024 | Lu ........................ H10B 12/482 |
| 2024/0023308 | A1* | 1/2024 | Chu .................... H01L 23/5283 |

FOREIGN PATENT DOCUMENTS

| | | |
|---|---|---|
| CN | 112652570 A | 4/2021 |
| CN | 113130636 A | 7/2021 |

* cited by examiner

METHODS FOR MANUFACTURING SEMICONDUCTOR DEVICES, AND SEMICONDUCTOR DEVICES

CROSS-REFERENCE TO RELATED APPLICATIONS

The present application is a national stage entry of International Application No. PCT/CN2021/109068, filed on Jul. 28, 2021, which claims the priority to the Chinese Patent Application 202110406661.4, titled "METHODS FOR MANUFACTURING SEMICONDUCTOR DEVICES, AND SEMICONDUCTOR DEVICES", filed to the CNIPA on Apr. 15, 2021. The entire contents of International Application No. PCT/CN2021/109068 and Chinese Patent Application 202110406661.4 are incorporated herein by reference.

TECHNICAL FIELD

The present application relates to, but is not limited to, a method for manufacturing a semiconductor device, and a semiconductor device.

BACKGROUND

The ohmic contact technology is a manufacturing technology commonly used in the manufacturing of semiconductor devices, wherein the ohmic contact refers to a region having linear and symmetrical current-voltage characteristic curves on the semiconductor device. The ohmic contact technology is to reduce the contact resistance between metals and non-metals in a semiconductor device (e.g., an integrated circuit), thereby effectively improving the electrical conductivity of the semiconductor device.

In typical ohmic contact technologies, the most common contact materials include TiSix (Ti is titanium element, Si is silicon element and x is a constant), CoSix (Co is cobalt element) or the like, where TiSix or CoSix is formed from Ti or Co on a silicon substrate. However, in the conventional manufacturing processes of ohmic contacts, it is likely that Ti or Co is not completely converted into compounds and is precipitated between metals and non-metals. In this way, when the semiconductor device is powered on, free Ti or Co will cause a short circuit in the metal layer of the semiconductor device, so that the electrical conductivity of the semiconductor device is reduced and the yield of the semiconductor device is thus affected.

Therefore, it is still worth considering how to solve the problem that it is likely to precipitate metals in a semiconductor device during the preparation of the ohmic contact and the resistance of the ohmic contact is reduced so as to ensure the performance and yield of the semiconductor device.

SUMMARY

An embodiment of the present application provides a method for manufacturing a semiconductor device, comprising:
  providing a substrate;
  forming a first conductive material layer on the substrate;
  performing plasma treatment on the first conductive material layer to form a first conductive layer, a surface area of an upper surface of the first conductive layer being greater than a surface area of an upper surface of the first conductive material layer;
  successively forming a second conductive layer, a first block layer, a third conductive layer and a fourth conductive layer on the first conductive layer;
  forming a dielectric layer on the fourth conductive layer, and forming an ohmic contact layer at a junction of the first conductive layer and the second conductive layer;
  removing a part of the dielectric layer, a part of the fourth conductive layer, a part of the third conductive layer, a part of the first block layer, a part of the second conductive layer, a part of the ohmic contact layer and a part of the first conductive layer, a remaining of the fourth conductive layer, the third conductive layer, the first block layer, the second conductive layer, the ohmic contact layer, the first conductive layer and the dielectric layer forming an initial bit line structure;
  performing $NH_3/N_2$ plasma treatment on the initial bit line structure to form a second block layer on a sidewall of the first conductive layer and a third block layer on a sidewall of the ohmic contact layer, the second block layer, the third block layer and the initial bit line structure forming a bit line structure, both the second block layer and the third block layer being configured to prevent metals in the ohmic contact layer from precipitation; and
  forming a bit line sidewall protection layer, the bit line sidewall protection layer covering a surface of the bit line structure.

In another aspect, the present application provides a semiconductor device, comprising:
  a substrate;
  a first conductive layer, arranged on the substrate, an upper surface of the first conductive layer being in an uneven shape;
  a second conductive layer, arranged on the first conductive layer, an ohmic contact layer being formed at a junction of the first conductive layer and the second conductive layer;
  a first block layer, arranged on the second conductive layer;
  a third conductive layer, arranged on the first block layer;
  a fourth conductive layer, arranged on the third conductive layer;
  a dielectric layer, arranged on the fourth conductive layer;
  a second block layer, arranged on a sidewall of the first conductive layer;
  a third block layer, arranged on the sidewall of the ohmic contact layer, the first conductive layer, the second conductive layer, the first block layer, the third conductive layer, the fourth conductive layer, the second block layer, the third block layer and the dielectric layer forming a bit line structure, both the second block layer and the third block layer being configured to prevent metals in the ohmic contact layer from precipitation; and
  a bit line sidewall protection layer, the bit line sidewall protection layer covering a surface of the bit line structure.

DETAILED DESCRIPTION

Figure 1:
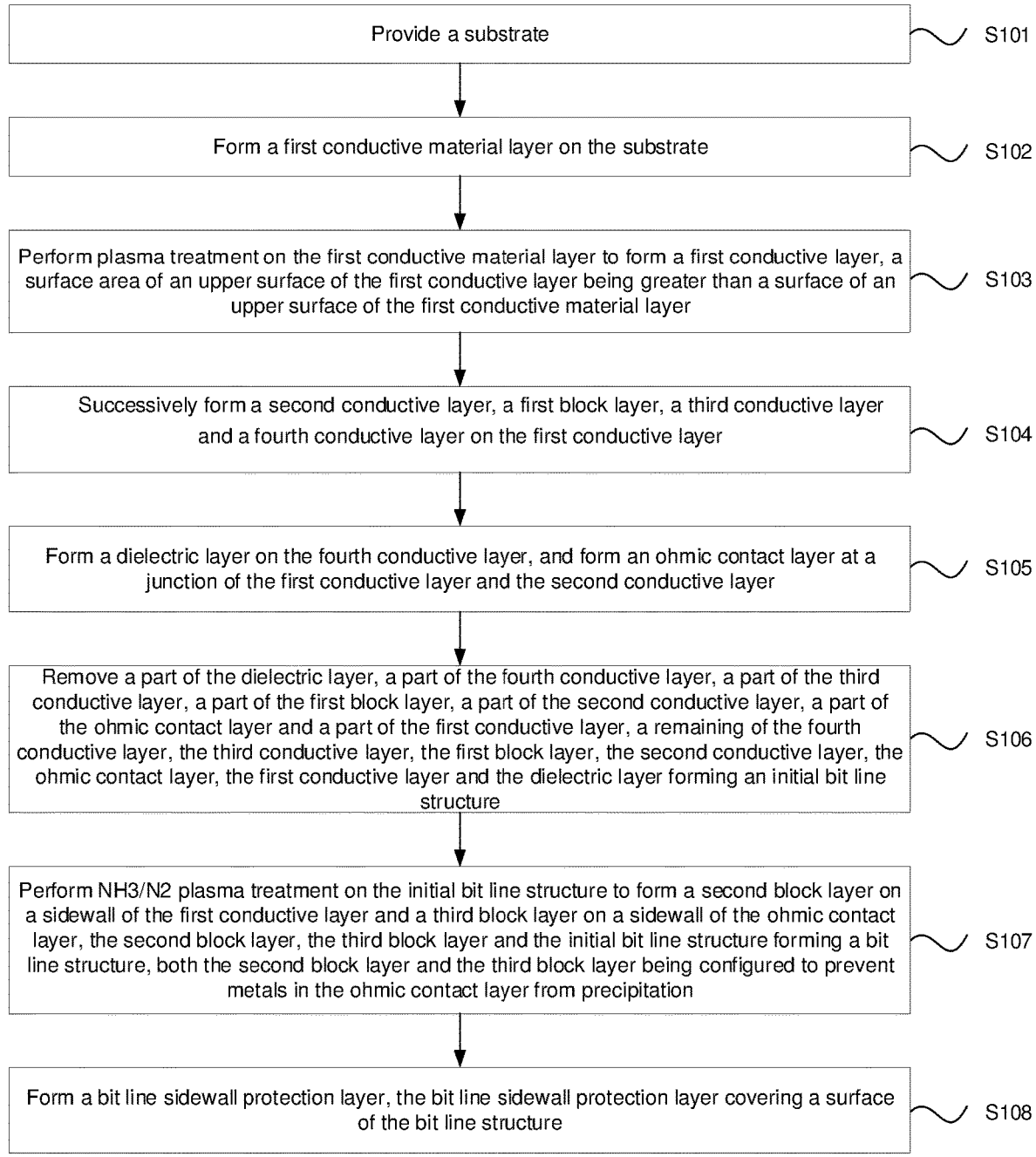
FIG. 1 is a flowchart of a method for manufacturing a semiconductor device according to an embodiment of the present application.

Exemplary embodiments will be described in detail below, and examples thereof are shown in the drawings. When the following description refers to the drawings, unless otherwise indicated, identical numerals in different drawings represent identical or similar elements. The implementations to be described in the following exemplary embodiments do not represent all implementations consistent with the present disclosure. In contrast, they are only examples of devices or methods consistent with what described in detail in the attached claims and some aspects of the present disclosure.

In the manufacturing of semiconductors, the ohmic contact technology, as a manufacturing technology, is to reduce the contact resistance between metals and non-metals in a semiconductor device (e.g., an integrated circuit), thereby effectively improving the electrical conductivity of the semiconductor device. In typical ohmic contact technologies, the most common contact materials include TiSiX (Ti is titanium element, Si is silicon element and x is a constant), CoSiX (Co is cobalt element) or the like, wherein TiSix or CoSix is formed from Ti or Co on a silicon substrate.

However, in the conventional manufacturing processes of ohmic contacts, it is likely that Ti or Co is not completely converted into compounds and is precipitated between metals and non-metals. In this way, when the semiconductor device is powered on, free Ti or Co will cause a short circuit in the metal layer of the semiconductor device, so that the electrical conductivity of the semiconductor device is reduced. With the continuous reduction of the feature size of large-scale integrated circuits and the continuous increasing requirements for device performances, the metal precipitation problem in the conventional manufacturing processes of ohmic contacts has seriously affected the yield of semiconductor devices.

On this basis, the present application provides a method for manufacturing a semiconductor device, and a semiconductor device. In the method for manufacturing a semiconductor device, a substrate is firstly provided; then, a first conductive layer, an ohmic contact layer, a second conductive layer, a first block layer, a third conductive layer, a fourth conductive layer and a dielectric layer are formed on the substrate in a stacked manner; and, a part of the first conductive layer, a part of the ohmic contact layer, a part of the second conductive layer, a part of the first block layer, a part of the third conductive layer, a part of the fourth conductive layer and a part of the dielectric layer are removed to form an initial bit line structure. $NH_3/N_2$ plasma treatment is performed on the initial bit line structure to obtain a bit line structure having a second block layer and a third block layer. The second block layer is formed on the sidewall of the first conductive layer, and the third block layer is formed on the sidewall of the ohmic contact layer. When there are metals that are not converted into compounds in the ohmic contact layer, the second block layer and the third block layer can effectively prevent metals that are not reacted completely (not converted into compounds) from precipitation, so that the problem that the conventional ohmic contact technology is easy to reduce the performance and yield of the semiconductor device is solved.

The method for manufacturing a semiconductor device according to the present application is applied to a semiconductor manufacturing device. The semiconductor manufacturing device may be an integrated device that can execute the method for manufacturing a semiconductor device described below. The semiconductor manufacturing device may also be a plurality of separate devices that execute one or more steps in the method for manufacturing a semiconductor device described below, respectively.

Referring to FIG. 1, Embodiment 1 of the present application provides a method for manufacturing a semiconductor device, comprising the following steps.

S101: A substrate is provided.

Optionally, the substrate 111 is a silicon substrate. The material of the substrate 111 can be selected according to actual needs, and will not be limited in the present application.

S102: A first conductive material layer is formed on the substrate.

Figure 2:
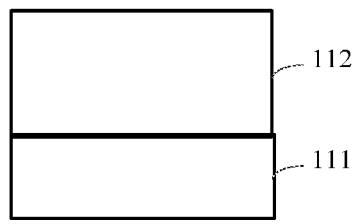
FIG. 2 is a partially schematic diagram of a semiconductor device according to Embodiment 1 of the present application.

FIG. 2 shows a schematic diagram after the first conductive material layer 112 is formed on the substrate. As shown in FIG. 2, the first conductive material layer 112 may be polycrystalline silicon doped with phosphorus ions. The phosphorus ions may also be replaced with other non-metal ions, for example, boron ions. The first conductive material layer 112 may be formed by ion implantation. For example, phosphorus ions are implanted into the substrate 111 to form the first conductive material layer 112 doped with phosphorus ions.

S103: Plasma treatment is performed on the first conductive material layer to form a first conductive layer, the surface area of the upper surface of the first conductive layer being greater than that of the upper surface of the first conductive material layer.

Plasma (also known as electric pulp) is the fourth state of matter besides the solid state, the liquid state and the gaseous state. The gas will become plasma under a high temperature or a strong electromagnetic field. At this time, the atoms in the gas will have more or less electrons than normal so as to form anions or cations, i.e., negatively or positively charged particles.

Since the plasma contains many carriers, the plasma can conduct electricity. By performing plasma treatment on the first conductive material layer 112, i.e., treating the first conductive material layer 112 by plasma, the first conductive layer 113 is formed.

Figure 3:
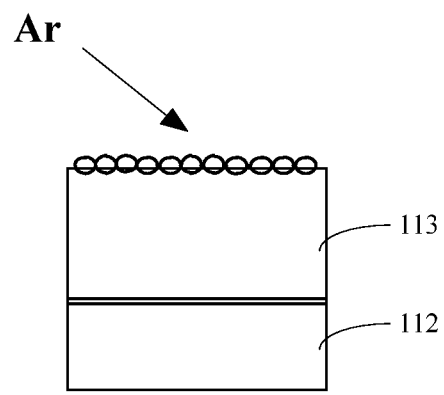
FIG. 3 is a partially schematic diagram of the semiconductor device according to Embodiment 1 of the present application.

Optionally, as shown in FIG. 3, it is possible to treat the upper surface of the first conductive material layer 112 by argon plasma (Ar), so that an uneven shape is formed on the upper surface of the first conductive material layer 112. The uneven shape is a corrugated shape as shown in FIG. 3. The uneven shape can increase the contact area between the first conductive layer 113 and the second conductive layer 115, thereby reducing the resistance of the finally formed ohmic contact layer 114.

By treating the upper surface of the first conductive material layer 112 by argon plasma, in addition to reducing the resistance of the ohmic contact layer 114, oxides on the surface of the first conductive material layer 112 can also be effectively removed, so that the disconnection between the first conductive layer 113 and the second conductive layer 115 is reduced, and the electrical conductivity of the semiconductor device is improved.

The parameters for the argon plasma can be selected according to actual needs, and will not be limited in the present application. Optionally, when the upper surface of the first conductive material layer 112 is treated by argon plasma, the treatment time may be 5 s to 20 s, the energy of the argon plasma treatment may be 300 W to 1000 W, and the temperature for the argon plasma treatment may be the room temperature. The gas flow rate for the argon plasma treatment may be 20 sccm to 200 sccm.

S104: A second conductive layer, a first block layer, a third conductive layer and a fourth conductive layer are successively formed on the first conductive layer.

When the material of the first conductive layer 113 is polycrystalline silicon doped with phosphorus ions, optionally, the material of the second conductive layer 115 may be Co or Ti.

When the material of the second conductive layer 115 is Co, the first block layer 116 may be Co-containing nitride, for example, CoN.

When the material of the second conductive layer 115 is Ti, the first block layer 116 may be Ti-containing nitride, for example, TiN.

Optionally, the material of the third conductive layer 117 may be tungsten-containing silicide, for example, WSi; and, the material of the fourth conductive layer 118 may be tungsten.

Figure 4:
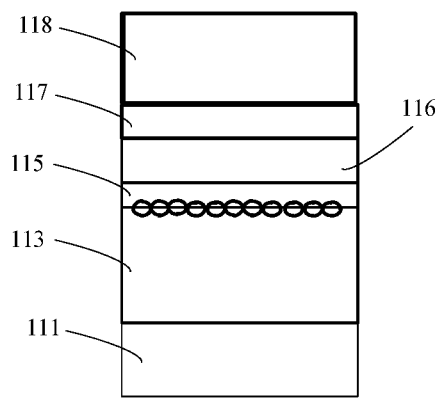
FIG. 4 is a partially schematic diagram of the semiconductor device according to Embodiment 1 of the present application.

FIG. 4 shows a schematic diagram after the second conductive layer, the first block layer, the third conductive layer and the fourth conductive layer are successively formed.

S105: A dielectric layer is formed on the fourth conductive layer, and an ohmic contact layer is formed at a junction of the first conductive layer and the second conductive layer.

Figure 5:
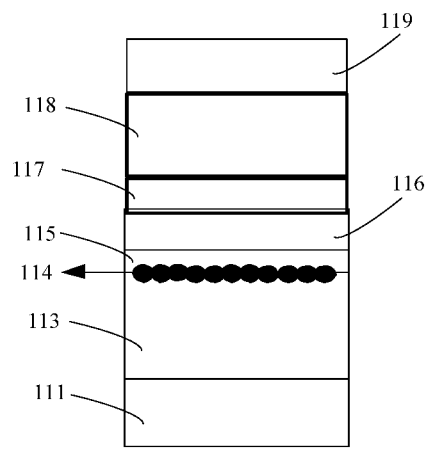
FIG. 5 is a partially schematic diagram of the semiconductor device according to Embodiment 1 of the present application.

As shown in FIG. 5, the dielectric layer 119 may also be interpreted as an insulating layer. The dielectric layer 119 is formed on the fourth conductive layer 118 and configured to isolate the fourth conductive layer 118 from the outside. Optionally, the material of the dielectric layer 119 may be silicon nitride.

Optionally, the dielectric layer 119 may be formed on the fourth conductive layer 118 by chemical vapor deposition at 600° C. to 650° C. The dielectric layer 119 has a thickness of 80 nm to 120 nm. By using chemical vapor deposition, the time required to form the dielectric layer 119 can be decreased, and the production cost can be reduced.

Since the temperature of forming the dielectric layer 119 is relatively high (600° C. to 650° C.), while the dielectric layer 119 is formed on the fourth conductive layer 118, the junction of the first conductive layer 113 and the second conductive layer 115 is reacted to form an ohmic contact layer 114. The ohmic contact layer 114 refers to a region having linear and symmetrical current-voltage characteristic curves. The ohmic contact layer 114 can reduce the contact resistance between the first conductive layer 113 and the second conductive layer 115 and thus effectively improve the electrical conductivity of the semiconductor device.

As shown in FIG. 5, when the material of the second conductive layer 115 is Ti, the ohmic contact layer 114 is a contact layer formed by reacting Ti with silicon in the first conductive layer 113, and the ohmic contact layer 114 includes $TiSi_2$. When the material of the second conductive layer 115 is Co, the ohmic contact layer 114 is a contact layer formed by reacting Co with silicon in the first conductive layer 113, and the ohmic contact layer 114 includes $CoSi_2$.

During the formation of the ohmic contact layer 114, a part of the metal (Ti or Co) may not react. If the unreacted metal is not isolated, the meal is easy to precipitate during the subsequent preparation of the semiconductor device, resulting in a short circuit in the semiconductor device.

S106: A part of the dielectric layer, a part of the fourth conductive layer, a part of the third conductive layer, a part of the first block layer, a part of the second conductive layer, a part of the ohmic contact layer and a part of the first conductive layer are removed, and the remaining of the fourth conductive layer, the third conductive layer, the first block layer, the second conductive layer, the ohmic contact layer, the first conductive layer and the dielectric layer form an initial bit line structure.

Figure 6:
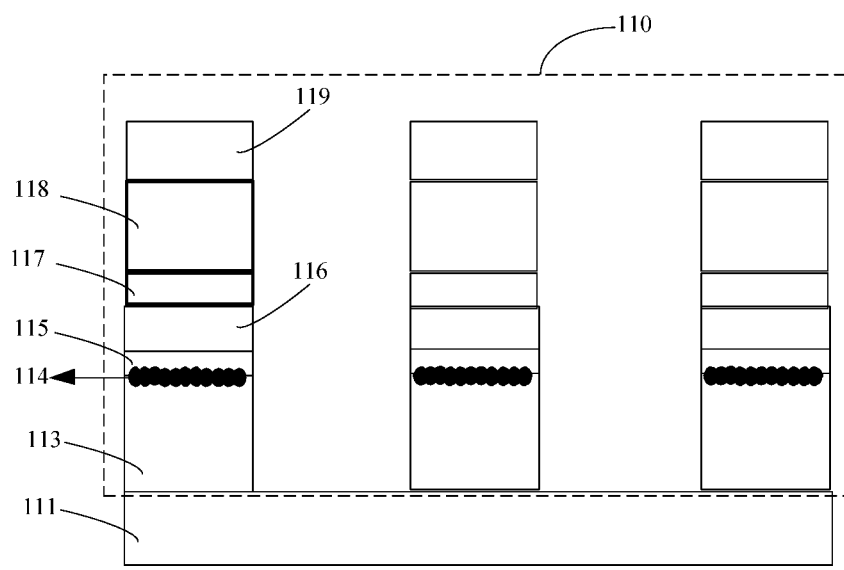
FIG. 6 is a schematic diagram of an initial bit line structure according to Embodiment 1 of the present application.

FIG. 6 shows the initial bit line structure 110. Compared with the structure shown in FIG. 5, the initial bit line structure 110 removes a part of the dielectric layer 119, a part of the fourth conductive layer 118, a part of the third conductive layer 117, a part of the first block layer 116, a part of the second conductive layer 115, a part of the ohmic contact layer 114 and a part of the first conductive layer 113. The initial bit line structure 110 is a plurality of structures having the same composition on the substrate 111. At this time, the ohmic contact layers 114 in the plurality of structures may precipitate the metal, so it is necessary to treat the ohmic contact layers 114 in the plurality of structures.

S107: $NH_3/N_2$ plasma treatment is performed on the initial bit line structure to form a second block layer 120 on the sidewall of the first conductive layer and a third block layer 130 on the sidewall of the ohmic contact layer, the second block layer 120, the third block layer 130 and the initial bit line structure forming a bit line structure, both the second block layer 120 and the third block layer 130 being configured to prevent metal in the ohmic contact layer 114 from precipitation.

Figure 7:
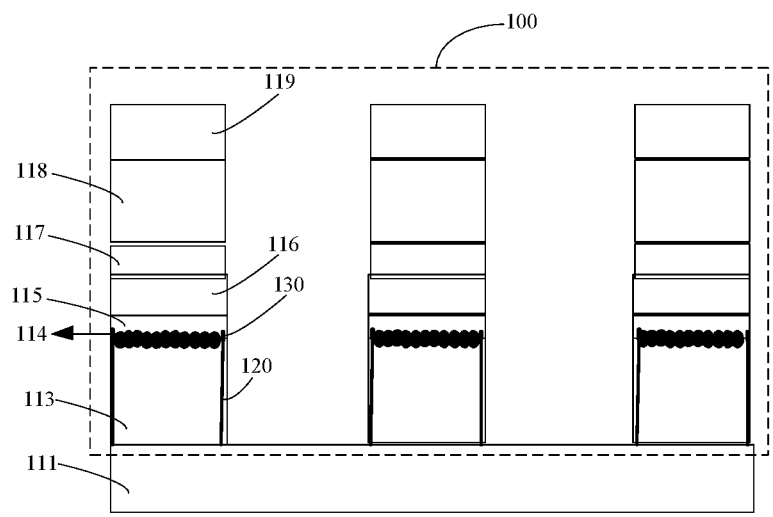
FIG. 7 is a schematic diagram of a bit line structure according to Embodiment 1 of the present application.

FIG. 7 shows a schematic diagram of the bit line structure 100 having the second block layer 120 and the third block layer 130.

When the material of the first conductive layer 113 is polycrystalline silicon doped with phosphorous ions and the material of the second conductive layer 115 is Ti, the material of the ohmic contact layer 114 is $TiSi_2$. At this time, the ohmic contact layer 114 may contain unreacted Ti. After $NH_3/N_2$ plasma treatment is performed on the initial bit line structure 110, silicon nitride may be formed on the sidewall of the first conductive layer 113 to serve as the second block layer 120, and TiN is formed on the sidewall of the ohmic contact layer 114 to serve as the third block layer 130. The second block layer 120 and the third block layer 130 can prevent the unreacted Ti in the ohmic contact layer 114 from precipitation.

When the material of the first conductive layer 113 is polycrystalline silicon doped with phosphorous ions and the material of the second conductive layer 115 is Co, the material of the ohmic contact layer 114 is $CoSi_2$. At this time, the ohmic contact layer 114 may contain unreacted Co. After $NH_3/N_2$ plasma treatment is performed on the initial bit line structure 110, silicon nitride may be formed on the sidewall of the first conductive layer 113 to serve as the second block layer 120, and CoN is formed on the sidewall of the ohmic contact layer 114 to serve as the third block layer 130. The second block layer 120 and the third block layer 130 can prevent the unreacted Co in the ohmic contact layer 114 from precipitation.

Optionally, the NH$_3$/N$_2$ plasma may also be replaced with other plasma that can perform nitridation, which can be specifically selected according to actual needs and will not be limited in the present application.

Optionally, during the treatment by NH$_3$/N$_2$ plasma, the gas flow rate of the NH$_3$ plasma may be 300 sccm to 2000 sccm.

S108: A bit line sidewall protection layer is formed, the bit line sidewall protection layer covering the surface of the bit line structure.

Figure 8:
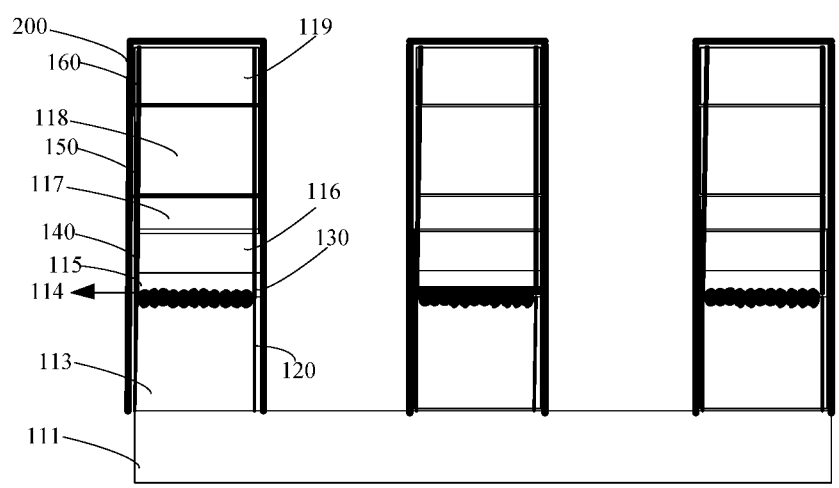
FIG. 8 is a schematic diagram of a semiconductor device according to Embodiment 1 and Embodiment 2 of the present application.

FIG. 8 shows a schematic diagram of the bit line sidewall protection layer covering the surface of the bit line structure (the second block layer and the third block layer are located on the inner side of the bit line sidewall protection layer, and the bit line sidewall protection layer is located on the outermost side). As shown in FIG. 8, the bit line sidewall protection layer 200 covers the surface of the bit line structure 100.

The material of the bit line sidewall protection layer 200 may be Si$_3$N$_4$.

Optionally, the bit line sidewall protection layer 200 may be formed by atomic layer deposition at 600° C. to 650° C. The bit line sidewall protection layer 200 has a thickness of 10 nm to 20 nm. By forming the bit line sidewall protection layer 200 by atomic layer deposition, the thickness of the bit line sidewall protection layer 200 at each position can be well controlled, thereby ensuring the performance of the semiconductor device. Of course, other methods can also be selected to form the bit line sidewall protection layer 200, and will not be limited in the present application.

The bit line sidewall protection layer 200 plays a similar role as the second block layer 120 and the third block layer 130. The bit line sidewall protection layer 200 can effectively prevent the metal precipitated in the ohmic contact layer 114 from leaving the bit line structure 100, so that the bit line structure 100 is protected from short circuit when in use, and the electrical conductivity and yield of the semiconductor device are effectively improved.

In the method for manufacturing a semiconductor device in this embodiment, the second block layer 120, the third block layer 130 and the bit line sidewall protection layer 200 are provided, the second block layer 120 is formed on the sidewall of the first conductive layer 113 of the initial bit line structure 110, the third block layer 130 is formed on the sidewall of the ohmic contact layer 114 of the initial bit line structure 110, and the bit line sidewall protection layer 200 covers the surface of the bit line structure 100. When there are metals precipitated in the ohmic contact layer 114, the second block layer 120, the third block layer 130 and the bit line sidewall protection layer 200 can prevent metals in the ohmic contact layer 114 from precipitation. Therefore, by the method for manufacturing a semiconductor device in this embodiment, the yield of the semiconductor device can be effectively improved.

In addition, in the method for manufacturing a semiconductor device in this embodiment, during the formation of the dielectric layer 119, the ohmic contact layer 114 is formed at the junction of the first conductive layer 113 and the second conductive layer 115. The upper surface of the first conductive layer 113 is in an uneven shape. In this way, the contact area between the first conductive layer 113 and the second conductive layer 115 can be increased, and the resistance of the finally formed ohmic contact layer 114 can be reduced.

Optionally, in Embodiment 1, the step S107 comprises the following step.

NH$_3$/N$_2$ plasma treatment is performed on the initial bit line structure 110 to form a second block layer 120 of the sidewall of the first conductive layer 113, a third block layer 130 is formed on the sidewall of the ohmic contact layer 114, a fourth block layer 140 is formed on the sidewall of the second conductive layer 115, a fifth block layer 150 is formed on the sidewall of the third conductive layer 117 and a sixth block layer 160 is formed on the sidewall of the fourth conductive layer 118. At this time, the second block layer 120, the third block layer 130, the fourth block layer 140, the fifth block layer 150, the sixth block layer 160 and the initial bit line structure 110 form the bit line structure 100.

As described in the related description of the step S207, the material of the second block layer 120 may be silicon nitride, and the material of the third block layer 130 may be TiN or CoN.

The material of the fourth block layer 140 is the same as the material of the first block layer 116. When the second conductive layer 115 is made of Ti, the material of the fourth block layer 140 is TiN. When the second conductive layer 115 is made of Co, the material of the fourth block layer 140 is CoN.

When the fifth block layer 150 is formed on the sidewall of the third conductive layer 117 and the third conductive layer 117 is made of tungsten silicide, the fifth block layer 150 contains tungsten silicide doped with nitrogen ions. When the fourth conductive layer 118 is made of tungsten, the sixth block layer 160 is made of tungsten silicide. The fifth block layer 150 and the sixth block layer 160 can effectively prevent tungsten from precipitation, thereby improving the electrical conductivity of the semiconductor device.

Optionally, the NH$_3$/N$_2$ plasma may also be replaced with other plasma that can perform nitridation, which can be specifically selected according to actual needs and will not be limited in the present application.

Referring to FIG. 8, Embodiment 2 of the present application provides a semiconductor device 10, comprising a substrate 111, a bit line structure 100 and a bit line sidewall protection layer 200, the bit line sidewall protection layer 200 covering the surface of the bit line structure. Optionally, the bit line sidewall protection layer 200 is a protection layer formed by atomic layer deposition at 600° C. to 650° C. The material of the bit line sidewall protection layer 200 may be Si$_3$N$_4$. Compared with other processes, by using the atomic layer deposition, the thickness of the bit line sidewall protection layer 200 at each position can be well controlled, thereby ensuring the performance of the semiconductor device.

The semiconductor device 10 comprises a substrate 111, a first conductive layer 113, an ohmic contact layer 114, a second conductive layer 115, a first block layer 116, a third conductive layer 117, a fourth conductive layer 118 and a dielectric layer 119, and further comprises a second block layer 120 and a third block layer 130. The first conductive layer 113, the second conductive layer 115, the first block layer 116, the third conductive layer 117, the fourth conductive layer 118, the second block layer 120, the third block layer 130 and the dielectric layer 119 form the bit line structure 100. In addition, the ohmic contact layer 114 is formed at a junction of the first conductive layer 113 and the second conductive layer 115.

Specifically, the dielectric layer 119 is arranged on the fourth conductive layer 118, and the fourth conductive layer 118 is arranged on the third conductive layer 117. The third conductive layer 117 is arranged on the first block layer 116, and the first block layer 116 is arranged on the second conductive layer 115. The second conductive layer 115 is arranged on the first conductive layer 113, and the ohmic contact layer 114 is formed at the junction of the second conductive layer 115 and the first conductive layer 113.

The second block layer 120 is arranged on the sidewall of the first conductive layer 113, the third block layer 130 is arranged on the sidewall of the ohmic contact layer 114, and both the second block layer 120 and the third block layer 130 are configured to prevent the metal in the ohmic contact layer 114 from precipitation. As described in the related description of Embodiment 1, the second block layer 120 may be made of silicon nitride, and the third block layer 130 may be made of titanium nitride or cobalt nitride. When there are unreacted metals in the ohmic contact layer 114, the second block layer 120 and the third block layer 130 can effectively prevent metals that are not reacted completely in the ohmic contact layer 114 from precipitation.

The first conductive layer 113 is arranged on the substrate 111, and the upper surface of the first conductive layer 113 is in an uneven shape. The uneven shape is advantageous to increase the contact area between the first conductive layer 113 and the second conductive layer 115 and reduce the resistance of the ohmic contact layer 114. In the manufacturing process of the semiconductor device 10, the first conductive layer 113 is obtained by performing plasma treatment on a first conductive material layer 112. The first conductive material layer 112 is arranged on the substrate 111. For example, the substrate 111 is a silicon substrate; and, for example, the first conductive material layer 112 is polycrystalline silicon doped with phosphorus ions. During the formation of the first conductive layer 113, the upper surface of the first conductive material layer 112 can be treated by argon plasma, so that an uneven shape is formed on the upper surface of the first conductive material layer 112 to form the first conductive layer 113.

When the material of the first conductive layer 113 is polycrystalline silicon doped with phosphorus ions, optionally, the material of the second conductive layer 115 may be Co or Ti. When the material of the second conductive layer 115 is Co, the first block layer 116 may be Co-containing nitride, for example, CoN, and the material of the ohmic contact layer 114 is $CoSi_2$. When the material of the second conductive layer 115 is Ti, the first block layer 116 may be Ti-containing nitride, for example, TiN, and the material of the ohmic contact layer 114 is $TiSi_2$.

Optionally, the material of the third conductive layer 117 may be tungsten-containing silicide, for example, WSi; and, the material of the fourth conductive layer 118 may be tungsten.

The dielectric layer 119 may be made of $Si_3N_4$, and the dielectric layer 119 and the ohmic contact layer 114 are formed simultaneously. Optionally, the dielectric layer 119 may be a silicon nitride layer formed on the fourth conductive layer 118 by chemical vapor deposition at 600° C. to 650° C.

Further, as shown in FIG. 8, the bit line structure 100 further comprises a fourth block layer 140, a fifth block layer 150 and a sixth block layer 160. The fourth block layer 140 is formed on the sidewall of the second conductive layer 115. If the second conductive layer 115 may be made of titanium or cobalt, the fourth block layer 140 may be made of titanium nitride or cobalt nitride. When the fifth block layer 150 is formed on the sidewall of the third conductive layer 117 and the third conductive layer 117 is made of tungsten, the fifth block layer 150 is made of tungsten nitride. When the sixth block layer 160 is formed on the sidewall of the fourth conductive layer 118 and the fourth conductive layer 118 is made of tungsten silicide, the sixth block layer 160 contains tungsten silicide doped with nitrogen ions.

In the semiconductor device in this embodiment, the second block layer 120, the third block layer 130 and the bit line sidewall protection layer 200 are provided, the second block layer 120 is formed on the surface of the first conductive layer 113 of the initial bit line structure 110, the third block layer 130 is formed on the surface of the ohmic contact layer 114 of the initial bit line structure 110, and the bit line sidewall protection layer 200 covers the surface of the bit line structure 100. When there are metals precipitated in the ohmic contact layer 114, the second block layer 120, the third block layer 130 and the bit line sidewall protection layer 200 can prevent metals in the ohmic contact layer 114 from precipitation. In addition, the fourth block layer 140, the fifth block layer 150 and the sixth block layer 160 can effectively prevent tungsten from precipitation. Therefore, by the method for manufacturing a semiconductor device in this embodiment, the electrical conductivity of the semiconductor device can be effectively improved, and the yield of the semiconductor device can be improved.

It is to be noted that, as used herein, the terms "comprise", "include" and any other variants thereof are intended to cover non-exclusive inclusion, so that processes, methods, articles or devices including a series of elements include not only these elements but also other elements not explicitly listed, or further include elements inherent to such processes, methods, articles or devices. Without further limitations, an element as defined by a statement "including a . . ." is not exclusive of additional identical elements in the processes, methods, articles or devices including this element.

The serial numbers of the above embodiments of the present application are only for description and do not represent the superiority or interiority of the embodiments.

The foregoing description merely shows the preferred embodiments of the present application, and is not intended to limit the patent scope of the present application. Any equivalent structure or equivalent flow transformation made by using the contents in this specification and the drawings of the present application, or direct or indirect applications in other related technical fields shall fall into the patent scope of the present application.

The invention claimed is:

1. A method for manufacturing a semiconductor device, comprising:
   providing a substrate;
   forming a first conductive material layer on the substrate;
   performing plasma treatment on the first conductive material layer to form a first conductive layer, a surface area of an upper surface of the first conductive layer being greater than a surface area of an upper surface of the first conductive material layer;
   successively forming a second conductive layer, a first block layer, a third conductive layer and a fourth conductive layer on the first conductive layer;
   forming a dielectric layer on the fourth conductive layer, and forming an ohmic contact layer at a junction of the first conductive layer and the second conductive layer;
   removing a part of the dielectric layer, a part of the fourth conductive layer, a part of the third conductive layer, a part of the first block layer, a part of the second conductive layer, a part of the ohmic contact layer and a part of the first conductive layer, remaining parts of the fourth conductive layer, the third conductive layer, the first block layer, the second conductive layer, the ohmic contact layer, the first conductive layer and the dielectric layer forming an initial bit line structure;

performing NH3/N2 plasma treatment on the initial bit line structure to form a second block layer on a sidewall of the first conductive layer and a third block layer on a sidewall of the ohmic contact layer;

wherein, the second block layer, the third block layer and the initial bit line structure are forming a bit line structure, and, both the second block layer and the third block layer are configured to prevent metals in the ohmic contact layer from precipitation; and forming a bit line sidewall protection layer, the bit line sidewall protection layer covering a surface of the bit line structure.

2. The method for manufacturing the semiconductor device according to claim 1, wherein the performing NH3/N2 plasma treatment on the initial bit line structure to form the bit line structure comprises:

performing NH3/N2 plasma treatment on the initial bit line structure to form the second block layer of the sidewall of the first conductive layer, the third block layer on the sidewall of the ohmic contact layer, a fourth block layer on a sidewall of the second conductive layer, a fifth block layer on a sidewall of the third conductive layer and a sixth block layer on a sidewall of the fourth conductive layer;

wherein the second block layer, the third block layer, the fourth block layer, the fifth block layer, the sixth block layer and the initial bit line structure form the bit line structure.

3. The method for manufacturing the semiconductor device according to claim 1, wherein the performing plasma treatment on the first conductive material layer to form the first conductive layer comprises:

treating the upper surface of the first conductive material layer by argon plasma to form an uneven shape on the upper surface of the first conductive material layer to form the first conductive layer.

4. The method for manufacturing the semiconductor device according to claim 1, wherein the forming the dielectric layer on the fourth conductive layer comprises:

forming the dielectric layer on the fourth conductive layer by chemical vapor deposition at 600° C. to 650° C.

5. The method for preparing the semiconductor device according to claim 1, wherein the forming the bit line sidewall protection layer comprises:

forming the bit line sidewall protection layer by atomic layer deposition at 600° C. to 650° C.

6. The method for manufacturing the semiconductor device according to claim 1, wherein a material of the first conductive material layer is polycrystalline silicon doped with phosphorus ions.

7. The method for manufacturing the semiconductor device according to claim 6, wherein a material of the second conductive layer is cobalt or titanium, and a material of the dielectric layer is silicon nitride.

8. The method for manufacturing the semiconductor device according to claim 7, wherein a material of the ohmic contact layer is cobalt silicide or titanium silicide.

9. A semiconductor device, comprising:

a substrate;

a first conductive layer, arranged on the substrate, an upper surface of the first conductive layer being in an uneven shape;

a second conductive layer, arranged on the first conductive layer, an ohmic contact layer being formed at a junction of the first conductive layer and the second conductive layer;

a first block layer, arranged on the second conductive layer;

a third conductive layer, arranged on the first block layer;

a fourth conductive layer, arranged on the third conductive layer;

a dielectric layer, arranged on the fourth conductive layer;

a second block layer, arranged on a sidewall of the first conductive layer;

a third block layer, arranged on a sidewall of the ohmic contact layer;

wherein, the first conductive layer, the second conductive layer, the first block layer, the third conductive layer, the fourth conductive layer, the second block layer, the third block layer and the dielectric layer are forming a bit line structure, and, both the second block layer and the third block layer are configured to prevent metals in the ohmic contact layer from precipitation; and a bit line sidewall protection layer, the bit line sidewall protection layer covering a surface of the bit line structure.

10. The semiconductor device according to claim 9, wherein the bit line structure further comprises:

a fourth block layer, formed on a sidewall of the second conductive layer;

a fifth block layer, formed on a sidewall of the third conductive layer; and a sixth block layer, formed on a sidewall of the fourth conductive layer.

11. The semiconductor device according to claim 9, wherein the dielectric layer is a dielectric layer formed on the fourth conductive layer by chemical vapor deposition at 600° C. to 650° C.

12. The semiconductor device according to claim 9, wherein the bit line sidewall protection layer is a bit line sidewall protection layer formed by atomic layer deposition at 600° C. to 650° C.

13. The semiconductor device according to claim 9, wherein a material of the first conductive layer is polycrystalline silicon doped with phosphorus ions.

14. The semiconductor device according to claim 13, wherein a material of the second conductive layer is cobalt or titanium, and a material of the dielectric layer is silicon nitride.

15. The semiconductor device according to claim 14, wherein a material of the ohmic contact layer is cobalt silicide or titanium silicide.

* * * * *